(12) United States Patent
Xu et al.

(10) Patent No.: US 11,204,659 B2
(45) Date of Patent: Dec. 21, 2021

(54) FLEXIBLE CIRCUIT BOARD AND DISPLAY DEVICE

(71) Applicant: Wuhan Tianma Micro-Electronics Co., Ltd., Wuhan (CN)

(72) Inventors: Ning Xu, Wuhan (CN); Zhihua Yu, Wuhan (CN); Tao Peng, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/837,532

(22) Filed: Apr. 1, 2020

(65) Prior Publication Data

US 2021/0132718 A1 May 6, 2021

(30) Foreign Application Priority Data

Oct. 31, 2019 (CN) .......................... 201911063567.2

(51) Int. Cl.
| | |
|---|---|
| *G06F 3/041* | (2006.01) |
| *G06K 7/10* | (2006.01) |
| *G06K 9/00* | (2006.01) |
| *H05K 1/02* | (2006.01) |
| *H05K 1/11* | (2006.01) |
| *H05K 1/14* | (2006.01) |
| *H05K 1/18* | (2006.01) |

(52) U.S. Cl.
CPC ......... *G06F 3/0412* (2013.01); *G06K 7/1093* (2013.01); *G06K 9/0002* (2013.01); *G06K 9/00013* (2013.01); *H05K 1/0259* (2013.01); *H05K 1/11* (2013.01); *H05K 1/113* (2013.01); *H05K 1/114* (2013.01); *H05K 1/118* (2013.01); *H05K 1/144* (2013.01); *H05K 1/189* (2013.01); *G06F 2203/04102* (2013.01); *G06F 2203/04103* (2013.01); *H05K 2201/10128* (2013.01); *H05K 2203/1388* (2013.01)

(58) Field of Classification Search
CPC ........ G06F 3/0412; G06F 2203/04102; H05K 3/361; H05K 3/403
See application file for complete search history.

(56) References Cited

U.S. PATENT DOCUMENTS

| | | | | |
|---|---|---|---|---|
| 6,564,454 | B1 * | 5/2003 | Glenn | ............... H01L 23/49572 29/852 |
| 2017/0277313 | A1 * | 9/2017 | Lee | ........................ G06F 3/0446 |

FOREIGN PATENT DOCUMENTS

| | | |
|---|---|---|
| CN | 101378046 A | 3/2009 |
| CN | 105404880 A | 3/2016 |

\* cited by examiner

*Primary Examiner* — Kevin M Nguyen
(74) *Attorney, Agent, or Firm* — Anova Law Group, PLLC

(57) ABSTRACT

The present disclosure provides a flexible circuit board. The flexible circuit board includes a substrate; a conductive layer, disposed on the substrate; and a cover layer, disposed on a side of the conductive layer facing away from the substrate. The flexible circuit board is provided with a through hole penetrating through the flexible circuit board in the thickness direction. The cover layer includes a hollowed-out region located at least at an edge of one side of the through hole. The conductive layer includes an electrostatic discharge section exposed in the hollowed-out region.

20 Claims, 13 Drawing Sheets

FLEXIBLE CIRCUIT BOARD AND DISPLAY DEVICE

CROSS-REFERENCES TO RELATED APPLICATIONS

This application claims the priority of Chinese patent application No. 201911063567.2, filed on Oct. 31, 2019, the entirety of which is incorporated herein by reference.

FIELD OF THE DISCLOSURE

The present disclosure generally relates to the field of display technology and, more particularly, relates to a flexible circuit board and a display device.

BACKGROUND

With the rapid development of display technology, in addition to existing functions such as information display, requirements on the appearance of a display are gradually increased. For example, a larger screen ratio is becoming a trend in the future market. Therefore, the fingerprint on display (FOD) recognition technology becomes popular among consumers.

In order to realize fingerprint recognition, a flexible circuit board is provided with a through hole in the fingerprint recognition region, such that light can be directed to an FOD recognition sensor through the through hole. However, the flexible circuit board also includes a conductive layer close to the through hole. Static electricity, generated during the assembly process and the operating process, may easily accumulate in the vicinity of the through hole. Because the accumulated static electricity may not have any path for releasing, the characteristics of the thin film transistor device may be affected, thereby causing undesired display effect such as white and black clusters formed in the fingerprint recognition region. In addition, when the electrostatic concentration is higher, the produced white and black clusters are more obvious. That is, the undesired display effect becomes more severe.

The disclosed flexible circuit board and display device are directed to solve one or more problems set forth above and other problems in the art.

BRIEF SUMMARY OF THE DISCLOSURE

One aspect of the present disclosure provides a flexible circuit board. The flexible circuit board includes a substrate; a conductive layer, disposed on the substrate; and a cover layer, disposed on a side of the conductive layer facing away from the substrate. The flexible circuit board is provided with a through hole penetrating through the flexible circuit board in the thickness direction. The cover layer includes a hollowed-out region located at least at an edge of one side of the through hole. The conductive layer includes an electrostatic discharge section exposed in the hollowed-out region.

Another aspect of the present disclosure provides a display device. The display device includes a display panel and a flexible circuit board. The display panel includes a display surface and a back surface opposite to the display surface. The flexible circuit board includes a substrate, a conductive layer disposed on the substrate, and a cover layer disposed on a side of the conductive layer facing away from the substrate. The flexible circuit board is provided with a through hole penetrating through the flexible circuit board in the thickness direction. The cover layer includes a hollowed-out region located at least at an edge of one side of the through hole. The conductive layer includes an electrostatic discharge section exposed in the hollowed-out region. One end of the flexible circuit board is connected to the display surface of the display panel, and another end of the flexible circuit board is bent to the back surface of the display panel. The display panel includes a display region, wherein the display region includes a fingerprint recognition region. In the direction perpendicular to a plane where the display panel is located, the fingerprint recognition region is overlapped with the through hole.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Various exemplary embodiments of the present disclosure will now be described in detail with reference to the accompanying drawings. It should be noted that the relative arrangement of the components and steps, numerical expressions and numerical values set forth in the embodiments are not intended to limit the scope of the present disclosure. The following description of the at least one exemplary embodiment is merely illustrative, and by no means can be considered as limitations for the application or use of the present disclosure.

It should be noted that techniques, methods, and apparatuses known to those of ordinary skill in the relevant art may not be discussed in detail, but where appropriate, the techniques, methods, and apparatuses should be considered as part of the specification.

It should be noted that similar reference numbers and letters indicate similar items in subsequent figures, and therefore, once an item is defined in a figure, it is not required to be further discussed or defined in the subsequent figures.

Figure 1:
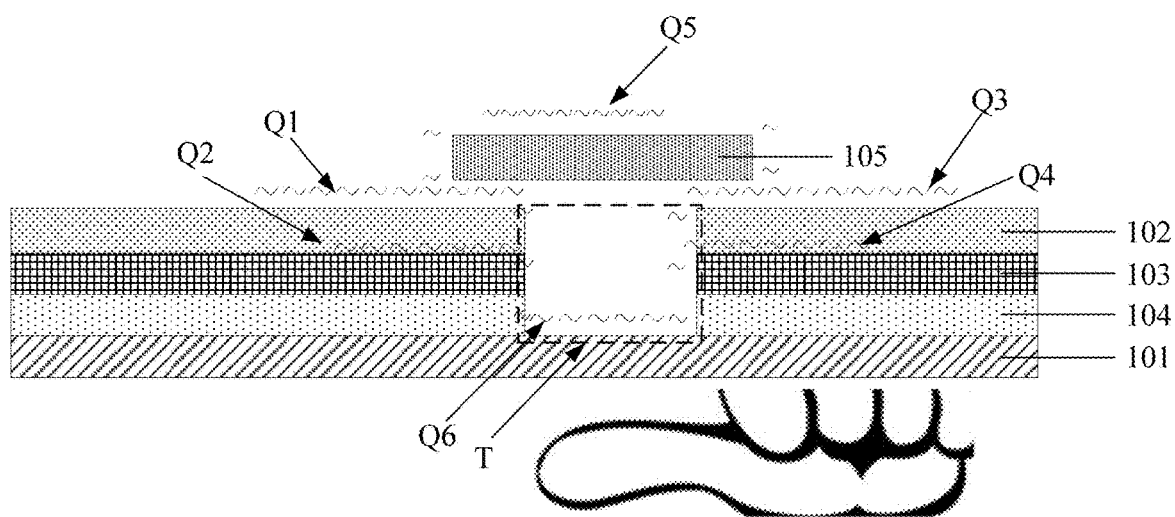
FIG. 1 illustrates a schematic cross-sectional view of an exemplary display device at a fingerprint recognition region according to various embodiments of the present disclosure.

FIG. 1 illustrates a schematic cross-sectional view of an exemplary display device at a fingerprint recognition region according to various embodiments of the present disclosure. Referring to FIG. 1, the display device may include a display panel 101, a flexible circuit board disposed on the side of the display panel facing away from the display surface, a foam layer disposed between the flexible circuit board 102 and the display panel 101, and a first protective film 104 between the foam layer 103 and the display panel 101. In order to allow light to pass through the display device, the display device may have a through hole T penetrating through the flexible circuit board 102, the foam layer 103, and the first protective film 104 in the fingerprint recognition region. In addition, in order to protect the internal structures of the display device, a layer of second protective film 105 may be pasted on the side of the through hole T facing away from the display panel 101.

During the assembly or use of the display device, static electricity may be easily generated. For example, during the process of attaching the flexible circuit board 102, static electricity may be easily generated on the surface of the flexible circuit board 102 (e.g., at the locations Q1, Q2, Q3, and Q4 in FIG. 1), and during the process of attaching the second protective film 105 on the side of the through hole T facing away from the display panel 101, static electricity may be easily generated on the surface of the second protective film 105 (e.g., at the location Q5). In addition, during the assembly process, when a worker wears insulation gloves to touch the fingerprint recognition region, static electricity may also be easily generated. Further, the generated static electricity may be accumulated inside the through hole T, e.g., at the location Q6. Because of the absence of release path, the accumulated static electricity may affect the characteristics of the thin film transistor device and cause a white cluster phenomenon near the fingerprint recognition region. When an electrostatic gun is used to discharge the static electricity in the fingerprint recognition region, black and white clusters may be produced due to rapid discharge.

Figure 2:
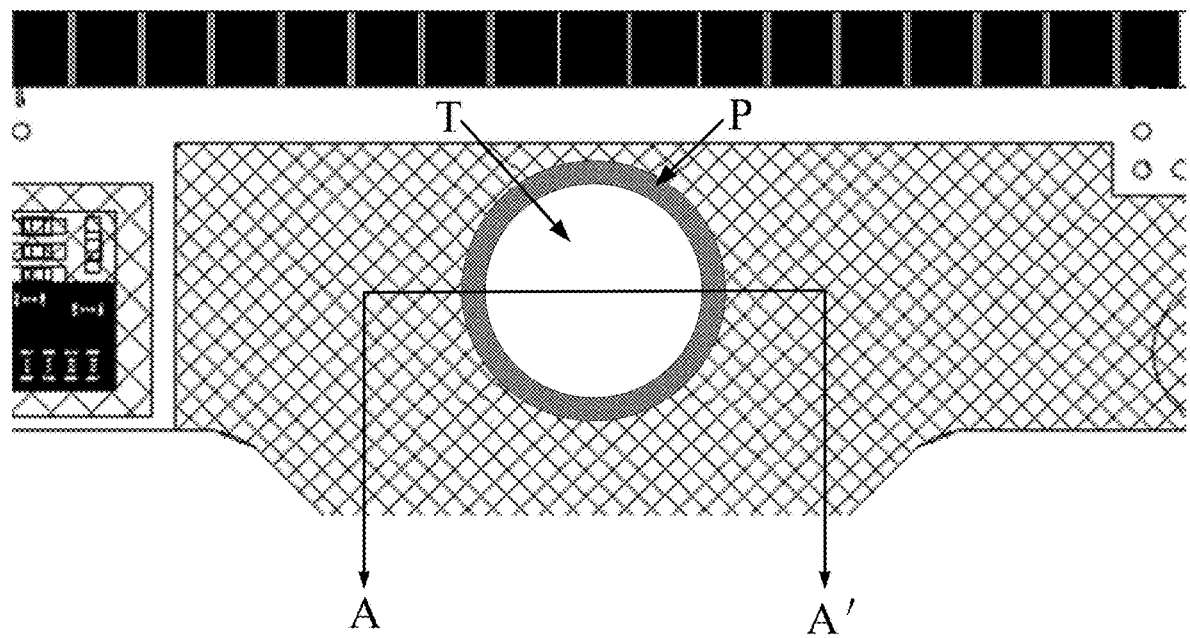
FIG. 2 illustrates a schematic top view of an exemplary flexible circuit board according to various embodiments of the present disclosure.
Figure 3:
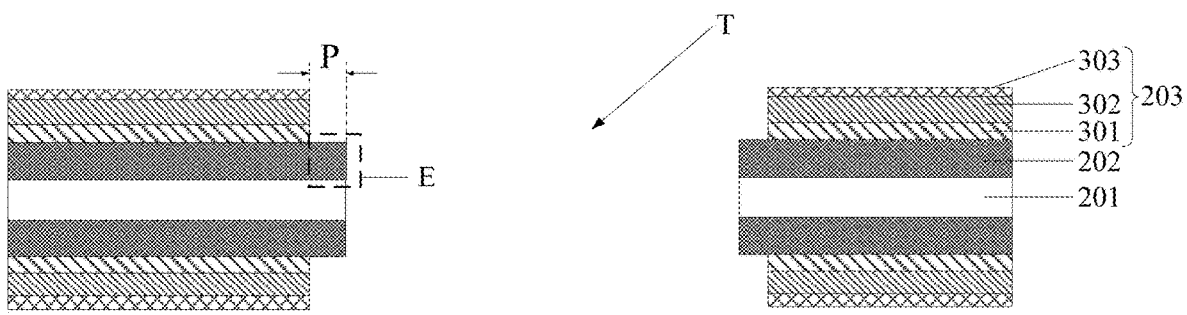
FIG. 3 illustrates a schematic cross-sectional view of the flexible circuit board shown in FIG. 2 along an AA' line.

Based on this, in view of the problem of undesired display caused by electrostatic accumulation in the fingerprint recognition region in the existing technology, the present disclosure provides a flexible circuit board to improve the display performance. FIG. 2 illustrates a schematic top view of an exemplary flexible circuit board according to various embodiments of the present disclosure; and FIG. 3 illustrates a schematic cross-sectional view of the flexible circuit board shown in FIG. 2 along an AA' line. Referring to FIGS. 2-3, the disclosed flexible circuit board may include a substrate 201, a conductive layer 202 disposed on the surface of the substrate 201, and a cover layer 203 disposed on the side of the conductive layer 202 facing away from the substrate 201.

In one embodiment, the flexible circuit board may have a through hole T penetrating through the flexible circuit board along the thickness direction; the cover layer 203 may have a hollowed-out region P located at least at the edge of one side of the through hole T; and the conductive layer 202 may include an electrostatic discharge section E exposed in the hollowed-out region P.

In the flexible circuit board provided by various embodiments of the present disclosure, the cover layer may have a hollowed-out region located at least at the edge of one side of the through hole, and the conductive layer may include an electrostatic discharge section exposed in the hollowed-out region. When static electricity is generated in the vicinity of the through hole, the static electricity may be released through the electrostatic discharge section, thereby avoiding the accumulation of electric charges in the fingerprint recognition region and preventing undesired display performance.

Figure 4:
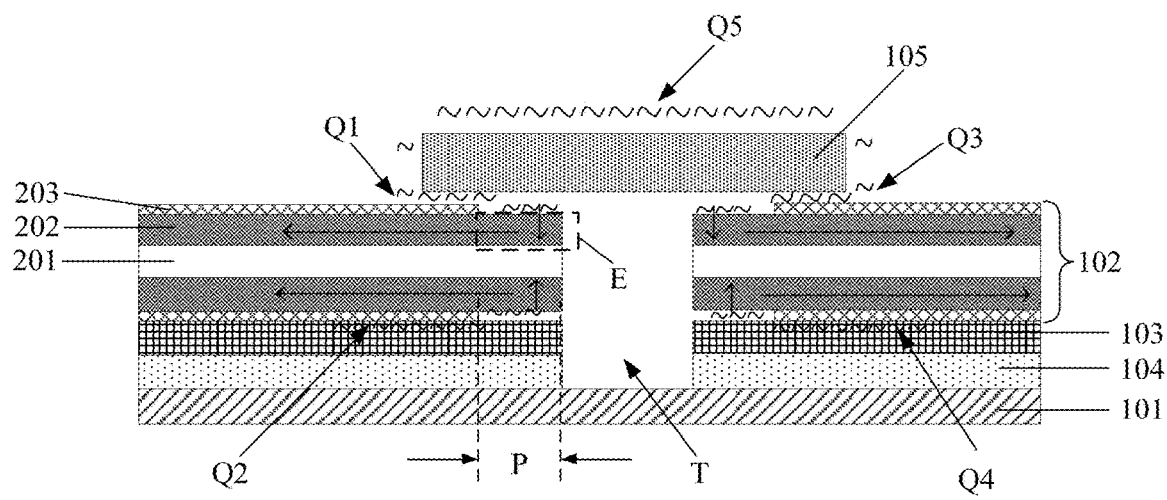
FIG. 4 illustrates a schematic cross-sectional view of another exemplary display device at a fingerprint recognition region according to various embodiments of the present disclosure.

FIG. 4 illustrates a schematic cross-sectional view of another exemplary display device at a fingerprint recognition region according to various embodiments of the present disclosure. Referring to FIG. 4, the display device adopts a flexible circuit board according to various embodiments of the present disclosure. Because the flexible circuit board 102 includes an electrostatic discharge section, the static electricity generated on the surface of the flexible circuit board 102 may be conducted out through the electrostatic discharge section E in the direction indicated by an arrow in FIG. 4, and the static electricity generated on the second protective film 105 may be conducted to the electrostatic discharge section E along the surface of the second protective film 105 and the surface of the flexible circuit board 102, and may then be conducted out through the electrostatic discharge section E. Therefore, static electricity generated during the assembly process or use of the display device may not be accumulated in the fingerprint recognition region, thereby avoiding the accumulation of electric charges in the fingerprint recognition region and preventing undesired display performance.

In one embodiment, the electrostatic discharge section E may be electrically connected to a fixed potential. For example, the electrostatic discharge section E may be connected to a ground point. The electrostatic discharge section E may be connected to the fixed potential through a wire, such that the static electricity may be conducted to the fixed potential for discharge.

In one embodiment, the conductive layer 202 of the flexible circuit board may include other conductive structures. However, the electrostatic discharge section E may not be electronically connected to other conductive structures that are disposed in the conductive layer 202, and thus dispose the electrostatic discharge section E in the conductive layer 202 may not affect other conductive structures in the conductive layer 202.

The electrostatic discharge section E may be completely exposed in the hollowed-out region P, or the electrostatic discharge section E may be partially exposed in the hollowed-out region P while the other portion of the electrostatic discharge section E may be covered by the cover layer. In actual applications, as long as other conductive structures in the conductive layer 202 are not affected, the electrostatic discharge section E may be arranged in any appropriate form.

In FIG. 2, the through hole T is described as a circle for illustration. In actual applications, the through hole T may have any other appropriate shape, such as an oval shape, a rectangular shape, a square shape, a polygon shape, etc., which is not specifically limited to the embodiments of the present disclosure.

The hollowed-out region P described above may be located at least at the edge of one side of the through hole T. For example, the hollowed-out region P may be located at one edge of the through hole T. In other examples, the hollowed-out region P may be provided at both edges of the through hole T, partially surround the through hole T, or completely surround the through hole T, etc. The above examples are only illustrative, and in actual applications, the hollowed-out region P may be provided in consideration of the position where static electricity is generated. In addition, the hollowed-out region P may have any appropriate shape such as a block shape, a strip shape, a curved shape, or a ring shape, which is not specifically limited to the embodiments of the present disclosure.

In the above-mentioned flexible circuit board according to various embodiments of the present disclosure, as shown in FIG. 3, the surface of the flexible circuit board on each side of the substrate 201 may have a conductive layer 202 and a cover layer 203. In other words, both sides of the flexible circuit board may have a hollowed-out region P and an electrostatic discharge section E exposed to the hollowed-out region P. Therefore, the static electricity generated on both sides of the flexible circuit board may be conducted out through the electrostatic discharge section E, thereby ensuring that the generated static electricity is not accumulated in the fingerprint recognition region, and the display device has a desired display performance.

In addition, when static electricity is easily generated on only one side of the flexible circuit board, the electrostatic discharge section E may also only be provided on one side of the flexible circuit board. Whether the electrostatic discharge section E is provided on one side or both sides of the flexible circuit board may be determined according to the actual needs, and is not limited by the embodiments of the present disclosure.

In one embodiment, referring to FIG. 3, in the flexible circuit board, the cover layer 203 may include an adhesive layer 301, and a protective layer 302 disposed on the side of the adhesive layer 301 facing away from the substrate 201.

By providing the protective layer 302 on the side of the conductive layer 202 facing away from the substrate 201, the conductive structures in the conductive layer 202 may be protected to prevent the conductive layer 202 from being damaged during the manufacturing process or the use process. In addition, the protective layer 302 and the conductive layer 202 may be adhered by the adhesive layer 301, such that the protective layer 302 may be firmly fixed on the side of the conductive layer 202 facing away from the substrate 201.

Further, in the flexible circuit board according to various embodiments of the present disclosure, as shown in FIG. 3, the cover layer 203 may further include an electromagnetic interference (EMI) film layer 303 located on the side of the protective layer 302 facing away from the substrate 201. The EMI film layer 303 may be able to shield electromagnetic waves, thereby preventing external electromagnetic waves from affecting the conductive layer 202. As such, the functions of the conductive structures in the conductive layer 202 may be prevented from being affected by electromagnetic waves.

Figure 5:
FIG. 5 illustrates a schematic cross-sectional view of an exemplary flexible circuit board according to various embodiments of the present disclosure.
Figure 6:
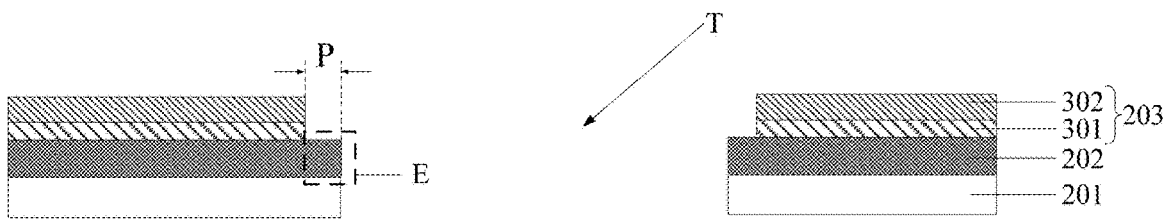
FIG. 6 illustrates a schematic cross-sectional view of another exemplary flexible circuit board according to various embodiments of the present disclosure.
Figure 7:
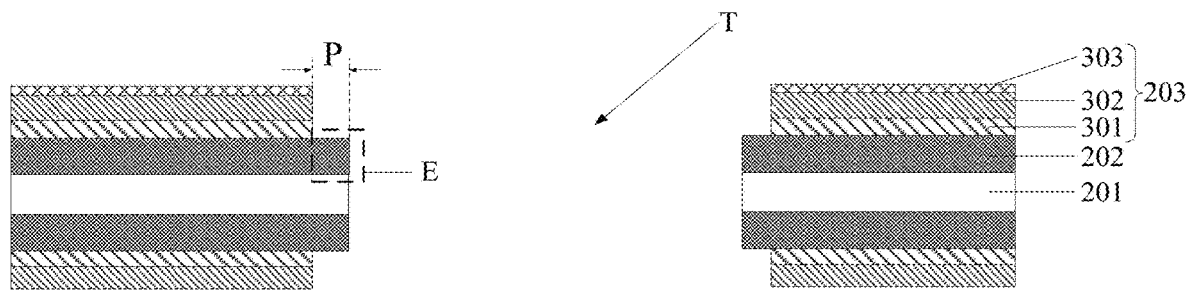
FIG. 7 illustrates a schematic cross-sectional view of another exemplary flexible circuit board according to various embodiments of the present disclosure.

In actually applications, in addition to the structure shown in FIG. 3, the flexible circuit board may be implemented in multiple ways. For example, as shown in FIG. 5, only one side of the flexible circuit board may be provided with a conductive layer 202, an adhesive layer 301, a protective layer 302, and an EMI film layer 303. That is, the flexible circuit board may only have an electrostatic discharge section E on one side. As shown in FIG. 6, the flexible circuit board may have a conductive layer 202, an adhesive layer 301, and a protective layer 302 on one side, that is, the flexible circuit board may not be provided with an EMI film layer. As shown in FIG. 7, the flexible circuit board may be provided with a conductive layer 202, an adhesive layer 301, and a protective layer 302 on both sides of the substrate 201, and an EMI film layer 303 on only one side of the substrate 201. FIG. 3 and FIGS. 5-7 are some examples of the structure of the flexible circuit board according to various embodiments of the present disclosure. In actual applications, the flexible circuit board may adopt any appropriate structure, which is not limited by the embodiments of the present disclosure.

For example, in the flexible circuit board according to various embodiments of the present disclosure, the electrostatic discharge section may be made of a metal material or a transparent conductive material. A metal material and a transparent conductive material may have desired electrical conductivity and thus may be able to quickly conduct static electricity out to avoid the process of releasing the static electricity from affecting the display performance of the display device. For example, the electrostatic discharge section may be made of a metal material such as gold, silver, copper, or the electrostatic discharge section may be made of a transparent conductive material such as indium tin oxide (ITO), or the electrostatic discharge section may be made of other conductive materials. For example, the electrostatic discharge section may be made of a material such as graphene. The material used for the electrostatic discharge section may be determined according to the actual needs and is not limited by the embodiments of the present disclosure.

In one embodiment, referring to FIG. 2 and FIG. 3, in the flexible circuit board according to various embodiments of the present disclosure, the hollowed-out region P may have a ring structure surrounding the through hole T.

By arranging the hollowed-out region P into a ring structure to surround the through hole T, the hollowed-out region P may be located at any side of the through hole T.

Because an electrostatic discharge section E is disposed in the hollowed-out region P, the static electricity generated at any side of the through hole may be conducted out through the electrostatic discharge section E disposed in the hollowed-out region P. In addition, because the hollow-out region P is provided at any side of the through hole T, the exposed area of the electrostatic discharge section E in the conductive layer 202 may be large, such that the static electricity may be quickly conducted out, and thus the efficiency of electrostatic discharge may be improved. In one embodiment, in the thickness direction of the flexible circuit board, the electrostatic discharge section E may cover the hollowed-out region P.

According to various embodiments of the present disclosure, the hollowed-out region may be implemented through the following two exemplary methods.

In an exemplary method, referring to FIG. 2, the inner edge of the hollowed-out region P may be overlapped with the outer edge of the through hole T, that is, the inner edge of the hollowed-out region P may also be the outer edge of the through hole T.

That it, there may not have any distance between the hollowed-out region and the through hole T. During the fabrication process, the electrostatic discharge section E may be exposed by removing the portion of the cover layer 203 that surrounds the through hole T. As such, when static electricity is generated near the through hole T, the static electricity may be quickly conducted out through the electrostatic discharge section E exposed to the hollowed-out region P, thereby avoiding the accumulation of static electricity. In addition, the static electricity generated on the surface of the flexible circuit board 202 may also be conducted out through the electrostatic discharge section E.

Figure 8:
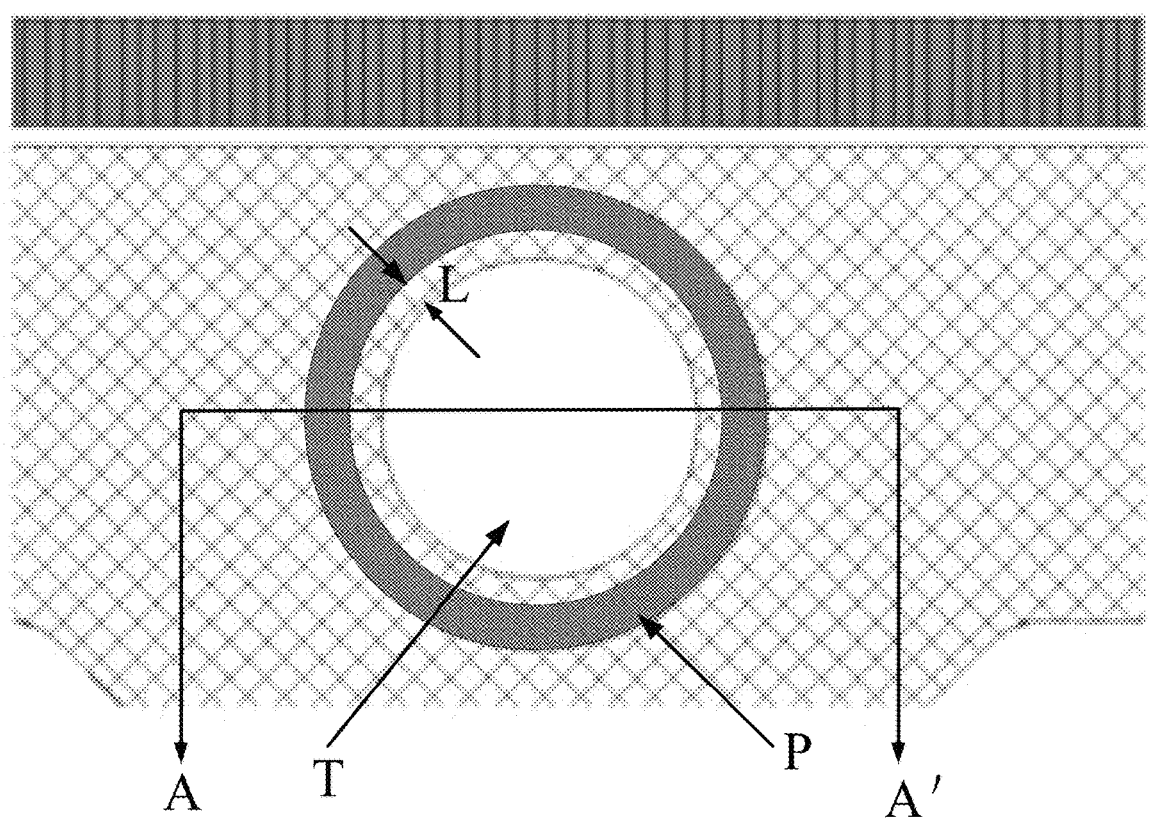
FIG. 8 illustrates a schematic top view of another exemplary flexible circuit board according to various embodiments of the present disclosure.
Figure 9:
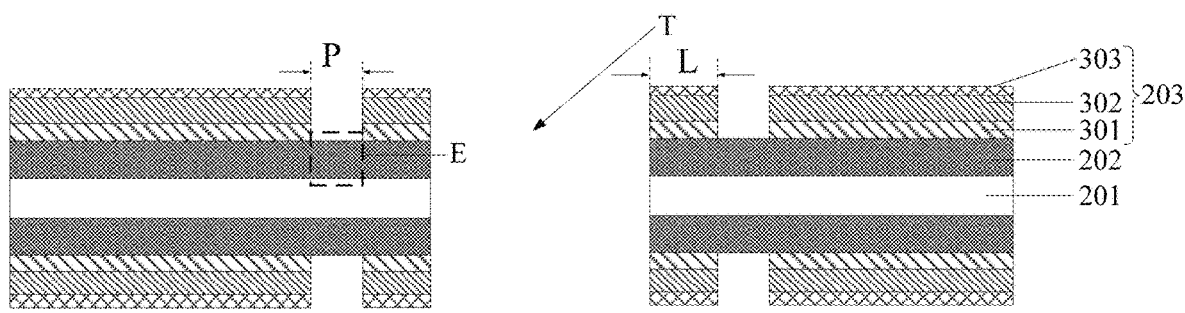
FIG. 9 illustrates a schematic cross-sectional view of the flexible circuit board shown in FIG. 8 along an AA' line.

In another exemplary method, the hollowed-out region may be separated from the through hole by a certain distance, that is, there may be a gap between the hollowed-out region and the through hole. FIG. 8 illustrates a schematic top view of another exemplary flexible circuit board according to various embodiments of the present disclosure; and FIG. 9 illustrates a schematic cross-sectional view of the flexible circuit board shown in FIG. 8 along an AA' line. Referring to FIGS. 8-9, the hollowed-out region P may have a distance L from the through hole T.

Figure 10:
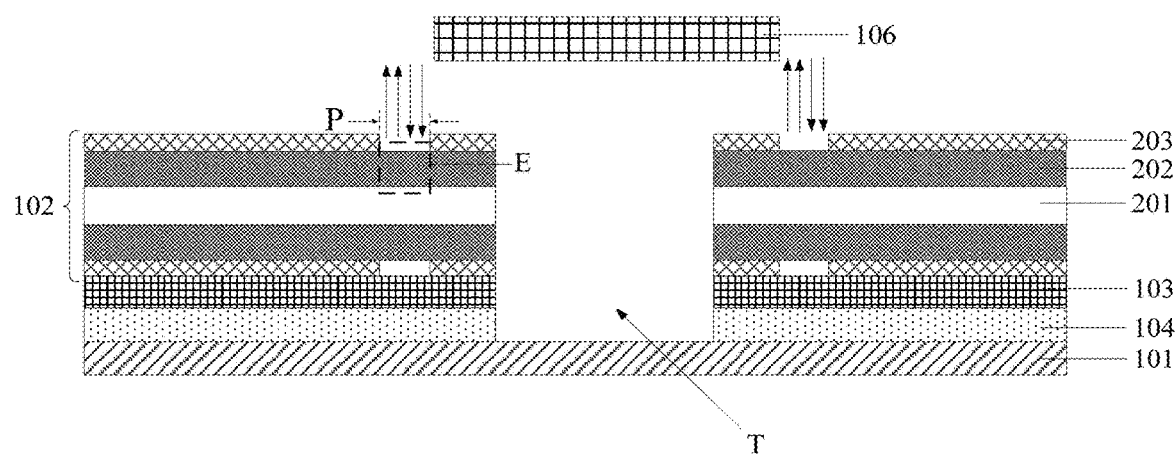
FIG. 10 illustrates a schematic cross-sectional view of another exemplary display device at a fingerprint recognition region according to various embodiments of the present disclosure.

FIG. 10 illustrates a schematic cross-sectional view of another exemplary display device at a fingerprint recognition region according to various embodiments of the present disclosure. Referring to FIG. 10, in the display device, a fingerprint recognition sensor 106 may be disposed on the side of the through hole T facing away from the display panel 101, and in the direction perpendicular to the display panel 101, the fingerprint recognition sensor 106 may cover the through hole T. When there is a gap between the fingerprint recognition sensor 106 and the flexible circuit board 102, the light reflected by the electrostatic discharge section E at the edge of the through hole T may be easily incident on the fingerprint recognition sensor 106, thereby affecting the detection result of the fingerprint recognition sensor 106.

According to the above implementation method, as shown in FIG. 10, by setting a distance between the hollowed-out region P and the through hole T, when light is incident on the electrostatic discharge section E in the hollowed-out region P, the light reflected by the electrostatic discharge section E may not pass through the fingerprint recognition sensor 106, and thus may not affect the detection result of the fingerprint sensor 106.

In addition, by setting a distance L between the hollowed-out region P and the through hole T, the electrostatic discharge section E in the hollowed-out region P may still be able to conduct out the static electricity without affecting the electrostatic discharge function of the flexible circuit board.

In one embodiment, the hollowed-out region P may be disposed in the direction perpendicular to the display panel 101, and the hollowed-out region P may not be completely overlapped with the fingerprint recognition sensor 106. For example, the hollowed-out region P may not have any region overlapped with the fingerprint recognition sensor 106, and thus the light reflected by the electrostatic discharge section E in the hollowed-out region P may not be able to pass through the fingerprint recognition sensor 106. In another example, the hollowed-out region P may be partially overlapped with the fingerprint recognition sensor 106, and thus among the light reflected by the electrostatic discharge section E in the hollowed-out region P, only a portion of the light may be directed to the fingerprint recognition sensor 106. As such, the influence on the detection result of the fingerprint recognition sensor 106 may be insignificant.

For example, in the flexible circuit board according to various embodiments of the present disclosure, as shown in FIGS. 8-9, the distance L between the hollowed-out region P and the through hole T may be larger than 0 and smaller than or equal to approximately 1 cm.

When the distance between the hollowed-out region P and the through hole T is 0, that is there is no gap between the hollowed-out region P and the through hole T, the light reflected by the electrostatic discharge section E in the hollowed-out region P may be easily incident on the fingerprint recognition sensor, and thus affect the detection result of the fingerprint recognition sensor. Therefore, in some embodiments of the present disclosure, the distance L between the hollowed-out region P and the through hole T may need to be larger than 0.

Further, setting the distance L between the hollowed-out region P and the through hole T to be smaller than or equal to approximately 1 cm may be able to ensure that the electrostatic discharge section E in the hollowed-out region P is able to conduct out the static electricity generated in the vicinity of the through hole T, and thus ensure the electrostatic discharge function of the flexible circuit board. Therefore, in some embodiments, the distance L between the hollowed-out region P and the through hole T may be larger than 0 and smaller than or equal to 1 mm.

Figure 11:
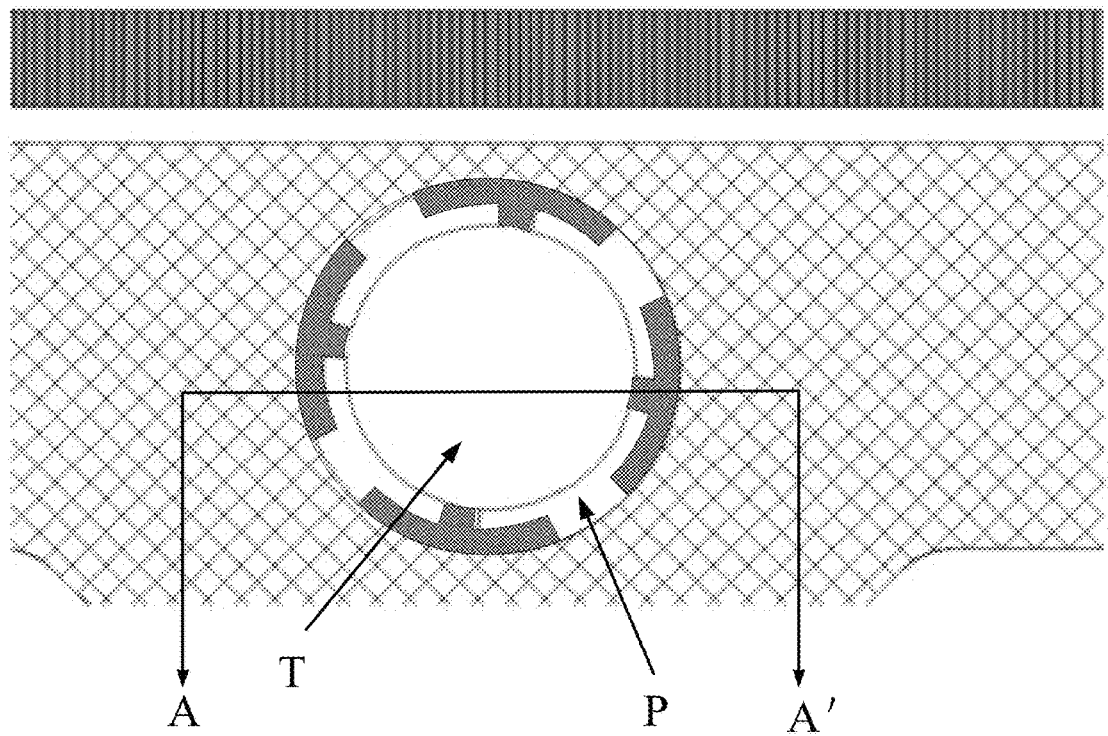
FIG. 11 illustrates a schematic top view of another exemplary flexible circuit board according to various embodiments of the present disclosure.
Figure 12:
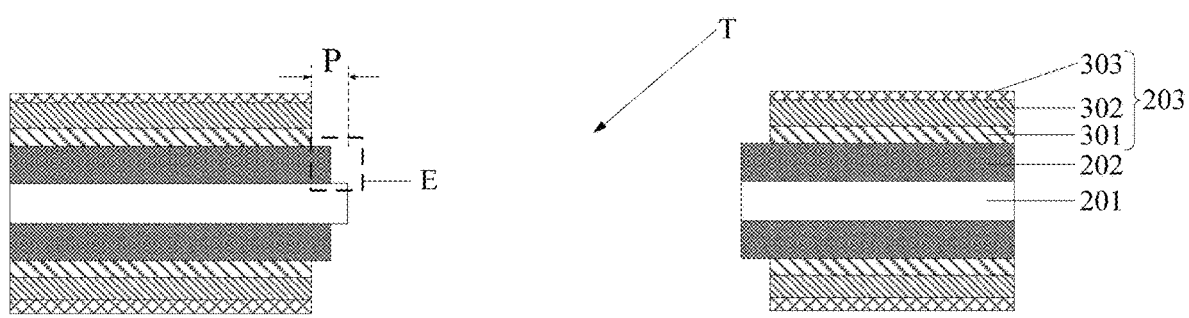
FIG. 12 illustrates a schematic cross-sectional view of the flexible circuit board shown in FIG. 11 along an AA' line.

FIG. 11 illustrates a schematic top view of another exemplary flexible circuit board according to various embodiments of the present disclosure; and FIG. 12 illustrates a schematic cross-sectional view of the flexible circuit board shown in FIG. 11 along an AA' line. Referring to FIGS. 11-12, in the flexible circuit board, the electrostatic discharge section E may have a hollow structure.

By setting the electrostatic discharge section E to have a hollow structure may be able to reduce the total area of the electrostatic discharge section E in the hollowed-out region P. When light is incident on the electrostatic discharge section E, because the total area of the electrostatic discharge section E in the hollowed-out region P is small, the light reflected by the electrostatic discharge section E may have a small amount, that is, the light that is directed to the fingerprint recognition sensor may not have a large amount. Therefore, the detection result of the fingerprint recognition sensor may be less affected.

In addition, as shown in FIG. 11, in order to ensure the electrostatic discharge effect of the electrostatic discharge section E in the hollowed-up region P, a portion of the pattern of the electrostatic discharge section E may be extended to the edge of the through hole T to conduct the static electricity generated in the vicinity of the through hole T.

The hollowed-out region P shown in FIGS. 11-12 is described to have an inner edge overlapped with the outer edge of the through hole T. In other embodiments, the hollowed-out region P may be separated from the through hole T by a certain distance, or the hollowed-out region P and the through hole T may be arranged in any appropriate relation.

Figure 13:
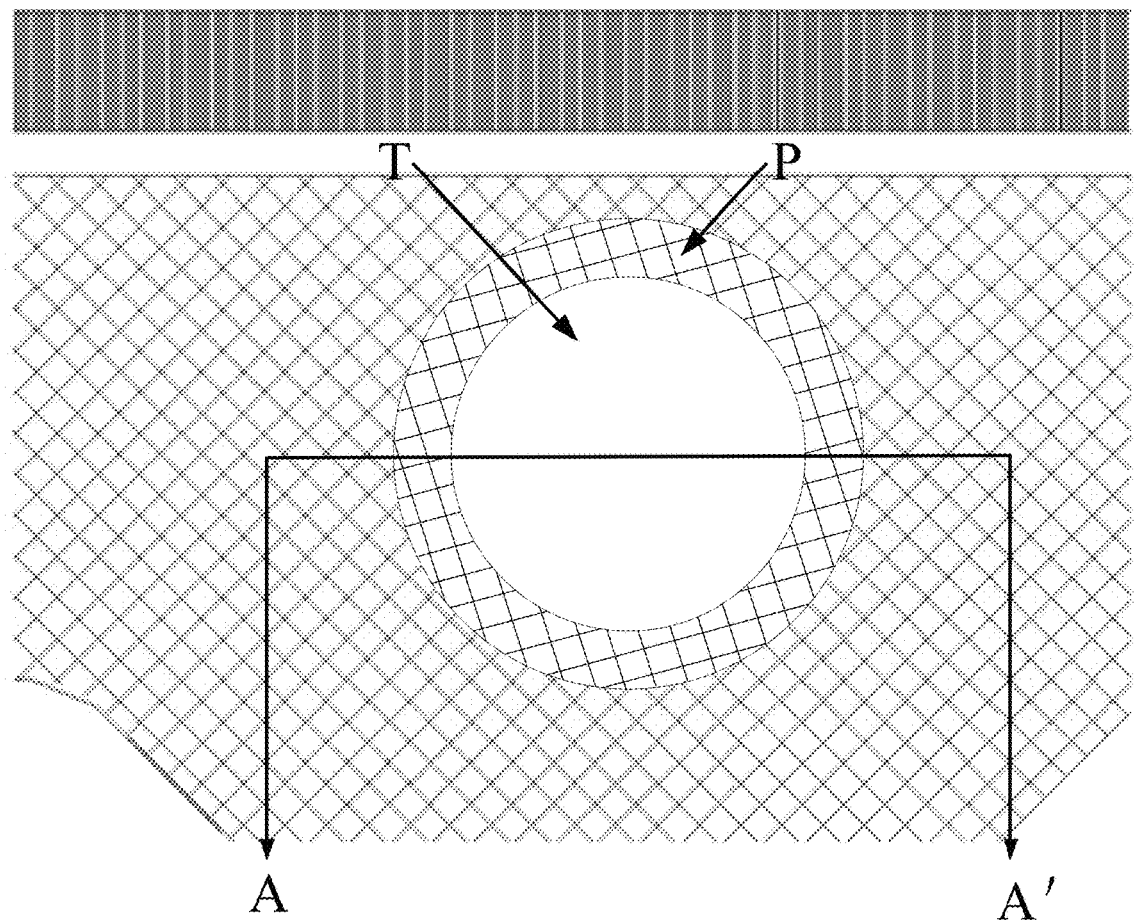
FIG. 13 illustrates a schematic top view of another exemplary flexible circuit board according to various embodiments of the present disclosure.
Figure 14:
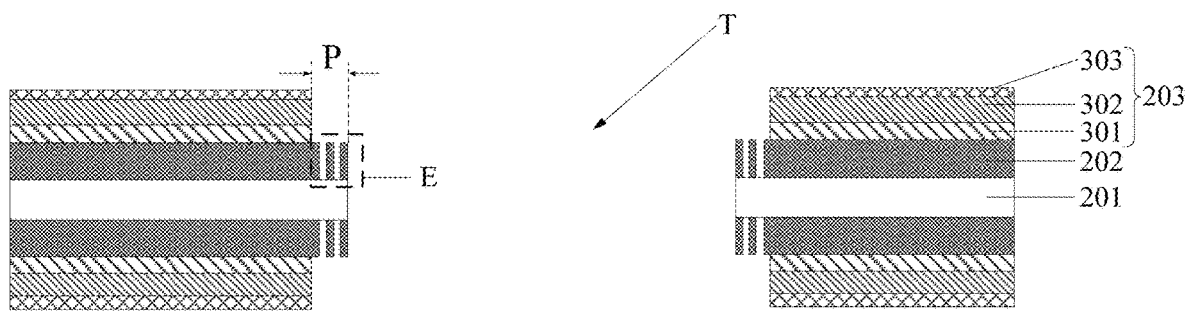
FIG. 14 illustrates a schematic cross-sectional view of the flexible circuit board shown in FIG. 13 along an AA' line.

FIG. 13 illustrates a schematic top view of another exemplary flexible circuit board according to various embodiments of the present disclosure; and FIG. 14 illustrates a schematic cross-sectional view of the flexible circuit board shown in FIG. 13 along an AA' line. Referring to FIGS. 13-14, in the flexible circuit board, the electrostatic discharge section E may have a grid-like structure.

By setting the electrostatic discharge section E to have a grid-like structure may be able to reduce the total area of the electrostatic discharge section E in the hollowed-out region P. When light is incident on the electrostatic discharge section E, because the total area of the electrostatic discharge section E in the hollowed-out region P is small, the light reflected by the electrostatic discharge section E may have a small amount, that is, the light that is directed to the fingerprint recognition sensor may not have a large amount. Therefore, the detection result of the fingerprint recognition sensor may be less affected.

In addition, because the electrostatic discharge section E has a grid-like structure, which means that the distribution the electrostatic discharge section E is uniform, the electrostatic discharge section E may still have desired capability of conducting static electricity, and thus the static electricity generated in the vicinity of the through hole T may be able to conducted out through the electrostatic discharge section E.

The hollowed-out region P shown in FIGS. 13-14 is described to be separated from the through hole T by a certain distance. In other embodiments, the hollowed-out region P may have an inner edge overlapped with the outer edge of the through hole T, or the hollowed-out region P and the through hole T may be arranged in any appropriate relation.

Figure 15:
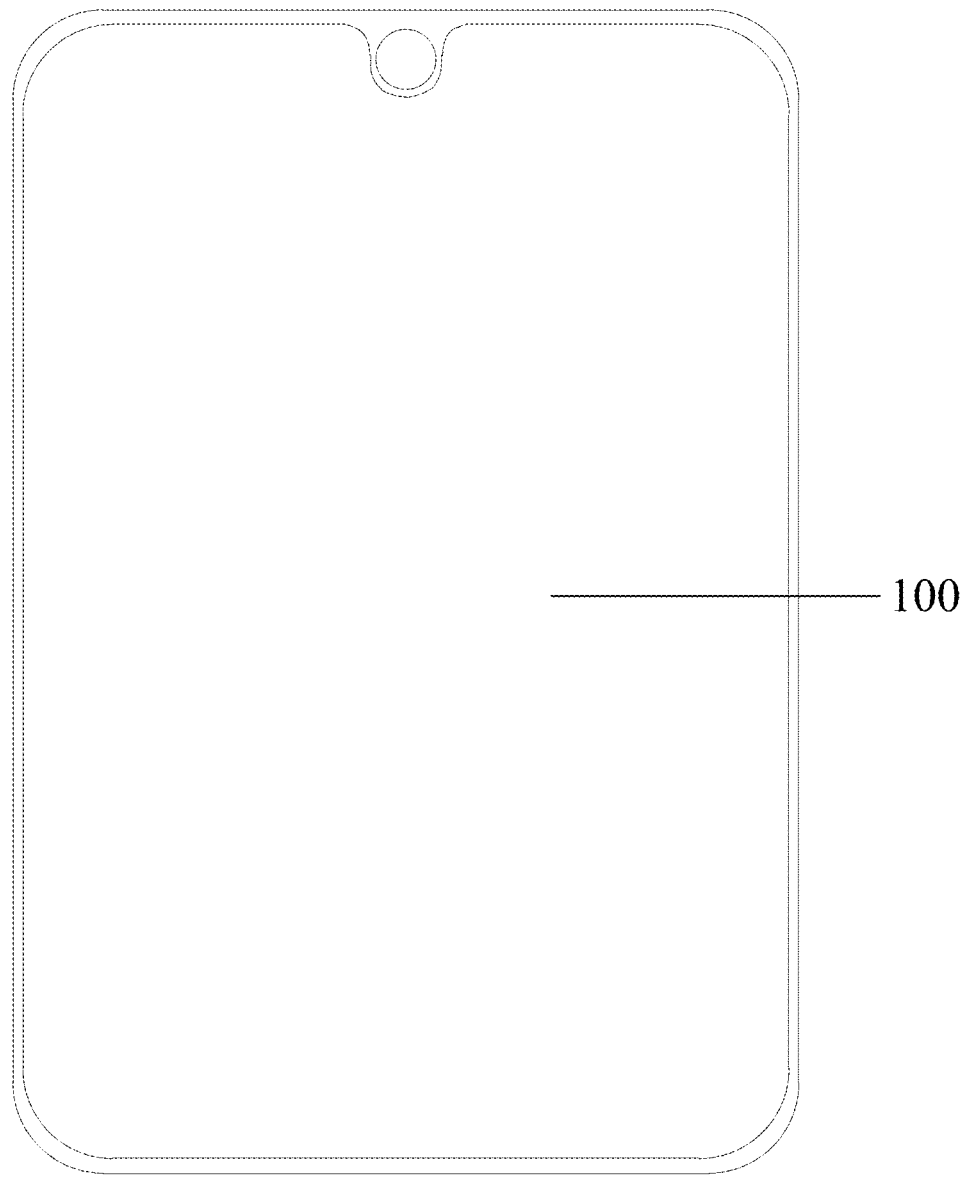
FIG. 15 illustrates a schematic structural diagram of an exemplary display device according to various embodiments of the present disclosure.

Further, the present disclosure also provides a display device. The display device may be applied to any appropriate product or component having a display function. For example, the display device may be applied to a mobile phone. FIG. 15 illustrates a schematic structural diagram of an exemplary display device according to various embodiments of the present disclosure. Referring to FIG. 15, in one embodiment, the display device may be applied to a mobile phone, and the mobile phone may adopt a flexible circuit board according to various embodiments of the present disclosure. In other embodiments, the display device may be applied to products or devices such as tablet computers, televisions, monitors, notebook computers, digital photo frames, navigators, etc. Since the principle of the display device for solving the problem in the existing technology is similar to that of the flexible circuit board described above, for exemplary implementation of the display device, reference may be made to the implementation of the flexible circuit board described above, and the details will not be described herein again.

Figure 16:
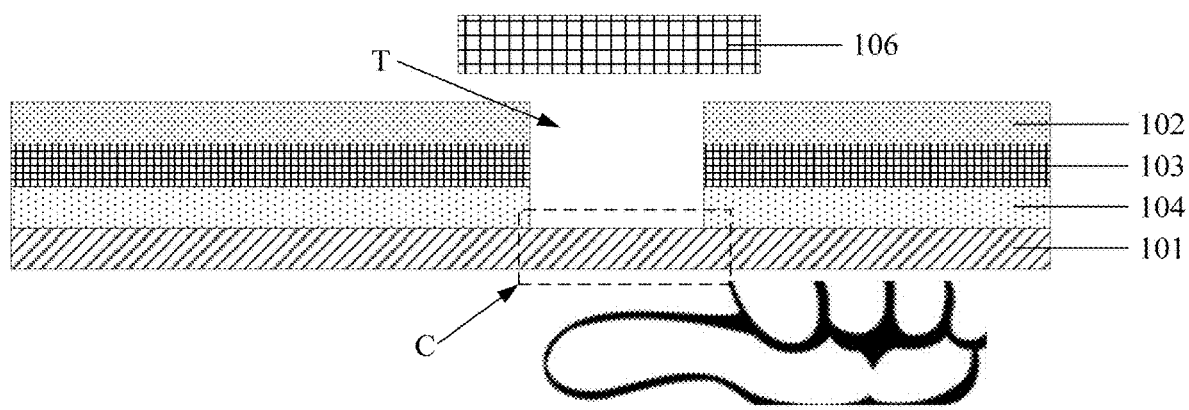
FIG. 16 illustrates a schematic cross-sectional view of another exemplary display device at a fingerprint recognition region according to various embodiments of the present disclosure.

FIG. 16 illustrates a schematic cross-sectional view of another exemplary display device at a fingerprint recognition region according to various embodiments of the present disclosure. Referring to FIG. 16, the display device may include a display panel 101 and a flexible circuit board 102 according to various embodiments of the present disclosure.

In one embodiment, the display panel 101 may include a display surface (such as a touch-control surface illustrated in FIG. 16), and a back surface opposite to the display surface. On end of the flexible circuit board 102 may be connected to the display surface of the display panel 102, and the other end may be bent to the back surface of the display panel 101.

Figure 17:
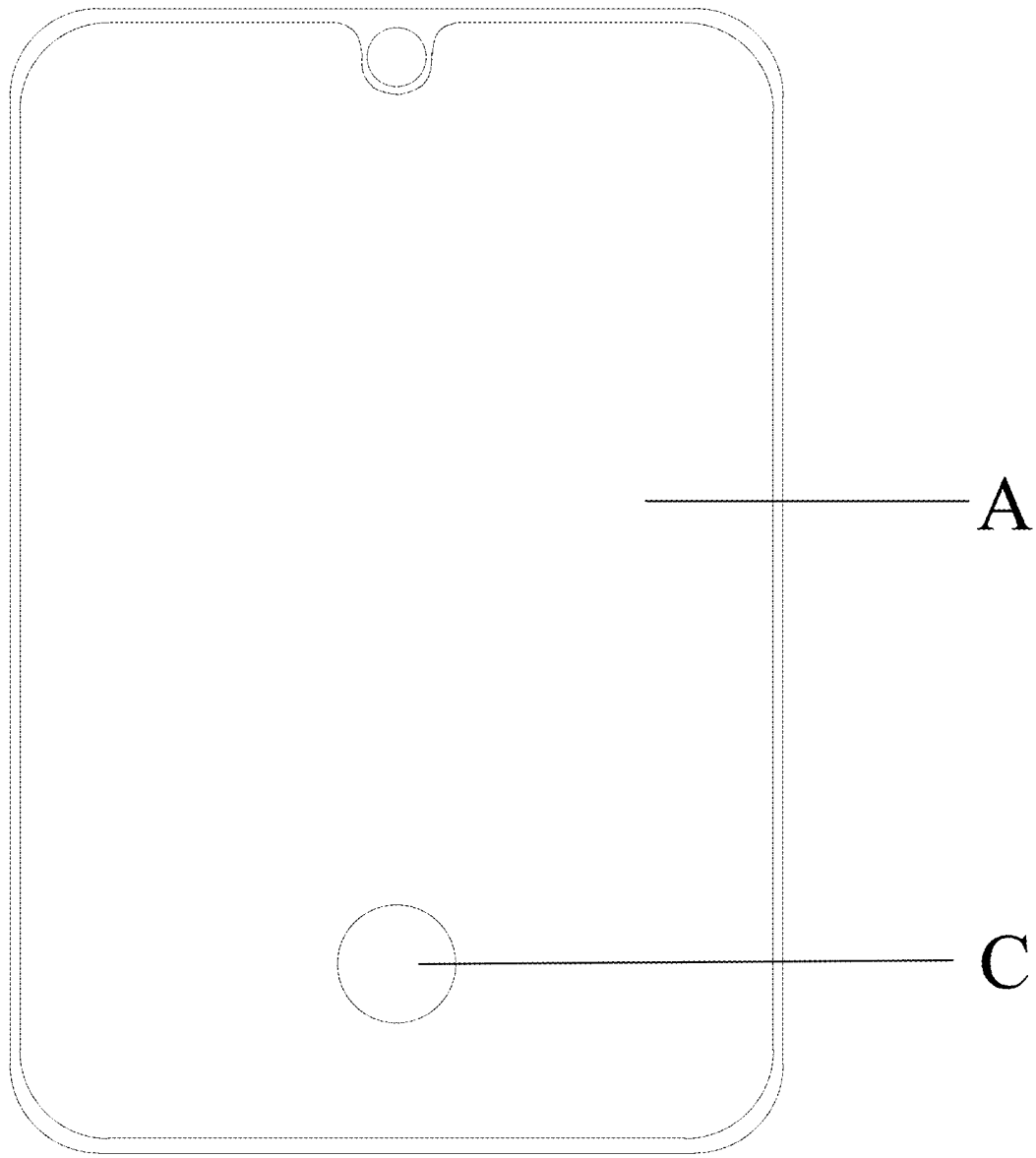
FIG. 17 illustrates a top view of an exemplary display panel according to various embodiments of the present disclosure.

FIG. 17 illustrates a top view of an exemplary display panel according to various embodiments of the present disclosure. The display panel 101 may include a display region A, and the display region A may include a fingerprint recognition region C. In a direction perpendicular to the plane where the display panel 101 is located, a through hole T may be overlapped with the fingerprint recognition region C.

According to various embodiments of the present disclosure, the display device includes a display panel and the flexible circuit board described above. Because in the flexible circuit board, the cover layer has a hollowed-out region located at least at the edge of one side of the through hole, and the conductive layer includes an electrostatic discharge section exposed in the hollowed-out region, when static electricity is generated in the vicinity of the through hole, the static electricity may be conducted out through the electrostatic discharge section. Therefore, the display device according to various embodiments of the present disclosure may not cause undesired display performance due to charge accumulation in the fingerprint recognition region.

Figure 18:
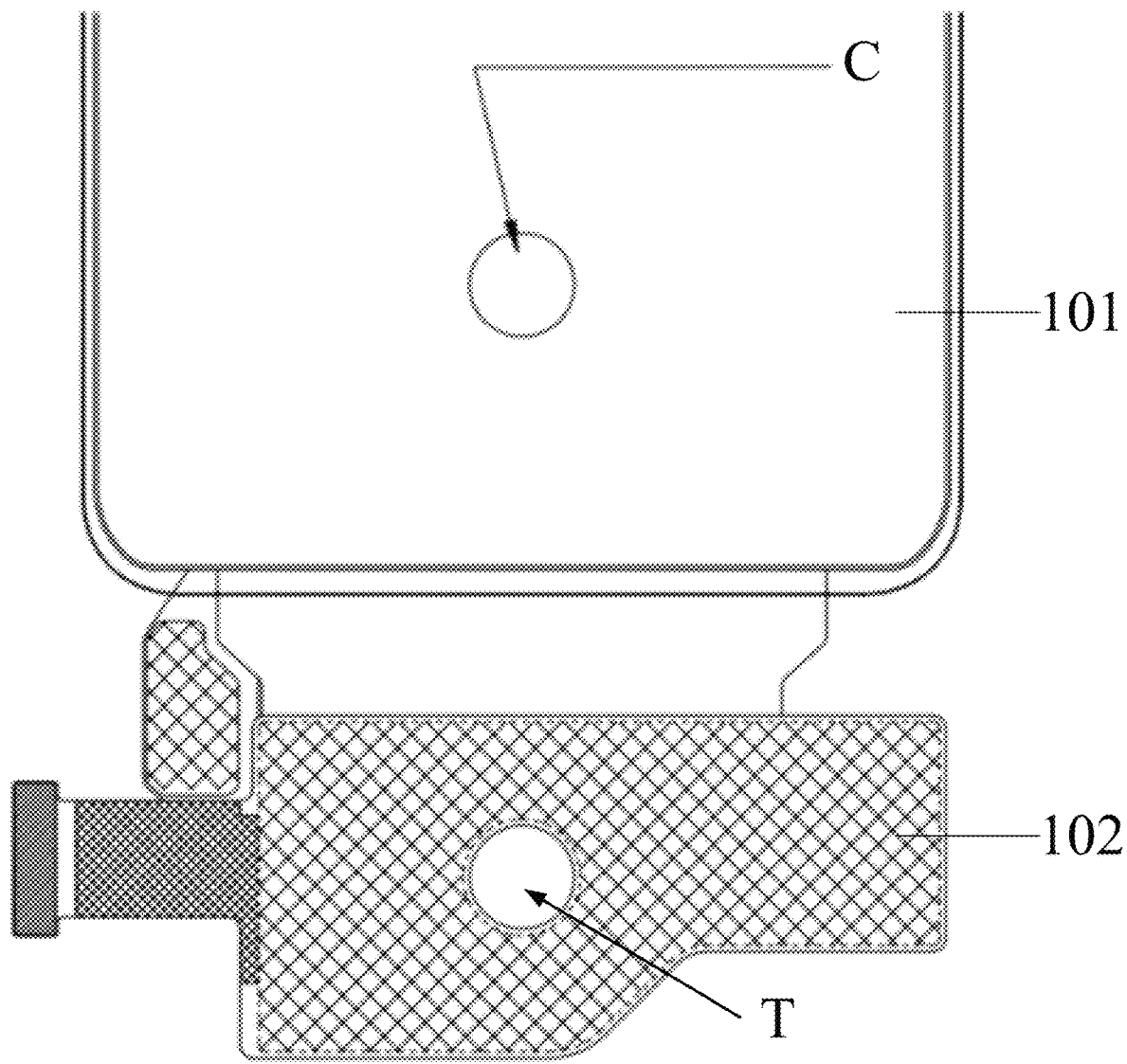
FIG. 18 illustrates a schematic top view of an exemplary display device according to various embodiments of the present disclosure before the flexible circuit board is bent.

FIG. 18 illustrates a schematic top view of an exemplary display device according to various embodiments of the present disclosure before the flexible circuit board is bent to the back surface of the display panel. Referring to FIG. 18, one end of the flexible circuit board 102 may be connected to the display surface of the display panel 102, and the through hole T of the flexible circuit board 102 may correspond to the fingerprint recognition region C in the display panel 101.

Figure 19:
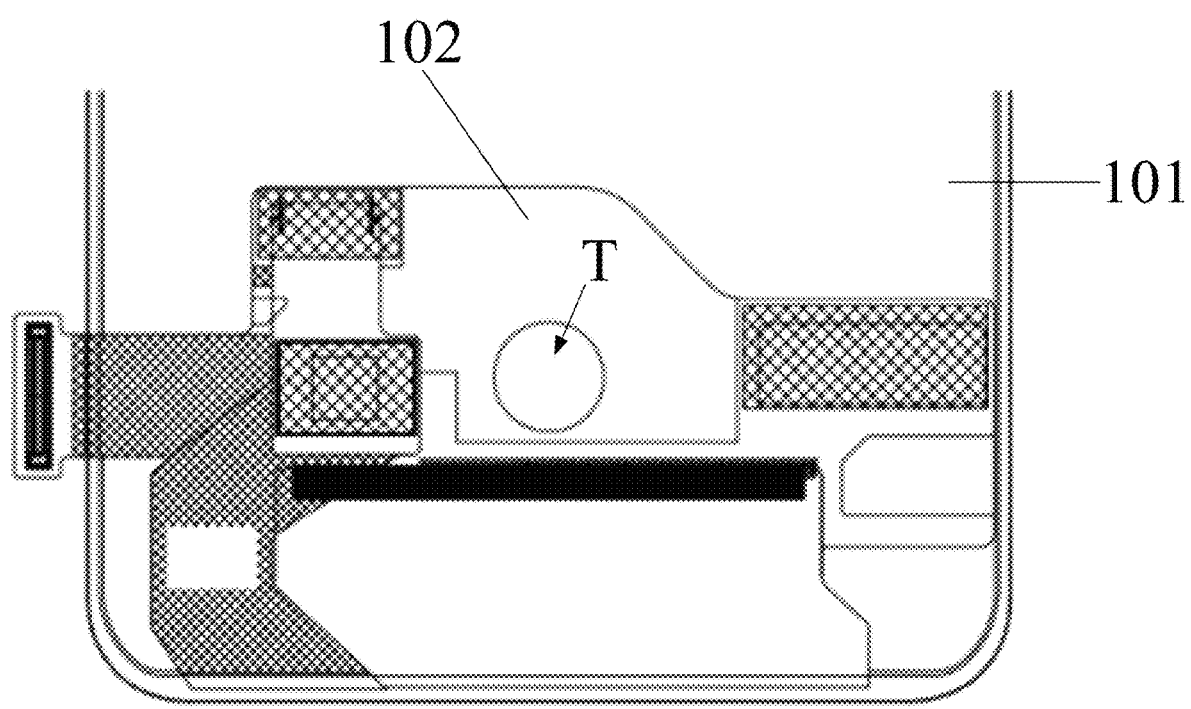
FIG. 19 illustrates a schematic bottom view of an exemplary display device according to various embodiments of the present disclosure after the flexible circuit board is bent.

FIG. 19 illustrates a schematic bottom view of an exemplary display device according to various embodiments of the present disclosure after the flexible circuit board is bent to the back surface of the display panel. Referring to FIG. 19, the other end of the flexible circuit board 102 may be bent to the back surface of the display panel 101, and after the flexible circuit board 102 is bent, in the direction perpendicular to the display panel 101, the through hole T of the flexible circuit board 102 may have a region overlapped with the fingerprint recognition region C of the display panel to ensure that the light is able to pass through the display panel 101 and the flexible circuit board 102. As such, the light may be incident on the fingerprint recognition sensor.

Referring to FIG. 16, the fingerprint recognition sensor 106 may emit light according to a certain rule. The light emitted by the fingerprint recognition sensor 106 may pass through the through hole T and the display panel 101, and exit from the display surface of the display panel 101. When a finger touches the fingerprint recognition region C of the display panel 101, the light reflected by the finger may pass through the display panel 101 and the through hole T again to be incident on the fingerprint recognition sensor 106. The fingerprint recognition sensor 106 may receive the reflected light and perform recognition and determination. Because the intensity of the light reflected from the ridges of the fingerprint is different from the intensity of the light reflected from the valleys of the fingerprint, the pattern of the finger, e.g. the fingerprint, may be determined.

In addition, referring to FIG. 16, the display device may further include a foam layer 103 disposed between the flexible circuit board 102 and the display panel 101, and a first protective film 104 disposed between the foam layer 103 and the display panel 101. The first protective film 104 may adhere the foam layer 103 and the display panel 101, such that the foam layer 103 can be fixed onto the back of the display panel 101. The other surface of the foam layer 103 may be bonded to the flexible circuit board 102, such that the flexible circuit board can be fixed onto the back of the display panel 101. Moreover, the foam layer 103 may serve as a buffer layer to prevent the display panel 101 and the flexible circuit board 102 from being damaged when the display device is pressed.

Figure 20:
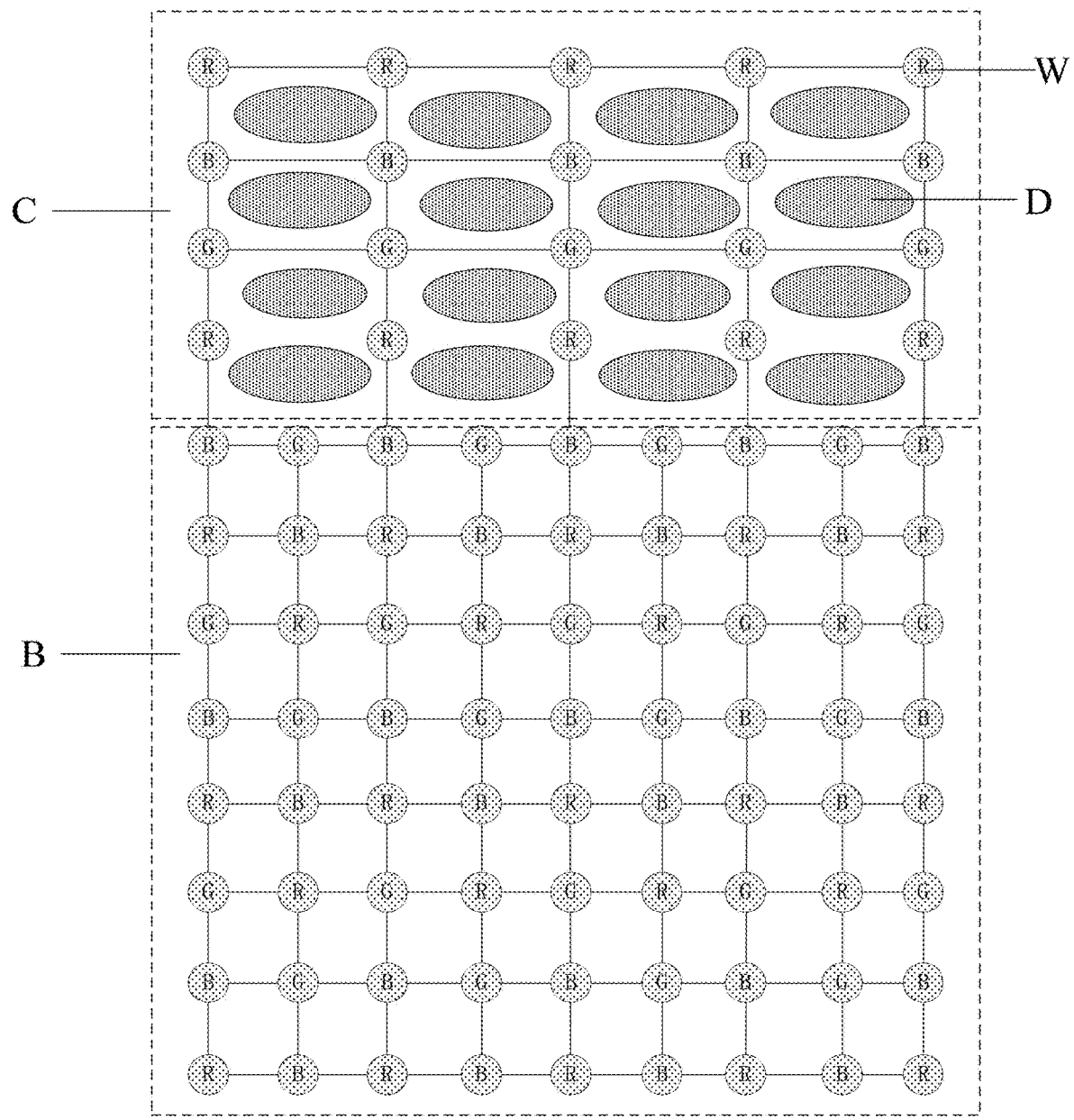
FIG. 20 illustrates a schematic structural diagram of a display region according to various embodiments of the present disclosure.

FIG. 20 illustrates a schematic structural diagram of a display region according to various embodiments of the present disclosure. Referring to FIG. 20, in the display device according, the display region may include a plurality of pixels W. In one embodiment, the display region may include a normal display region B, and the pixel density in the fingerprint recognition region C may be smaller than the pixel density in the normal display region B.

Referring to FIG. 20, a plurality of circles may be used to represent the plurality of pixels W; however, the present disclosure is not intended to limit the shape of the pixel. In other embodiments, the pixel may have any other appropriate shape. The letters, e.g. R, G, B, shown in the plurality of circles that represents the plurality of pixels W may represent the colors of the corresponding pixels. In FIG. 20, only a limited number of pixels W and a certain pixel arrangement are illustrated; however, the present disclosure is not intended to limit the number and the arrangement of the pixels.

In practical applications, the fingerprint recognition sensor may need to receive sufficient light to achieve fingerprint recognition. Therefore, the pixels in the fingerprint recognition region C may need to be set sparsely, that is, the pixel density in the fingerprint recognition region C may be set to be smaller than the pixel density in the normal display region B.

In addition, in the fingerprint recognition region C, a transparent region D may be set between adjacent pixels. Therefore, during the fingerprint recognition process, light can pass through the transparent region D between adjacent pixels of the plurality of pixels W to ensure that the light emitted by the fingerprint recognition sensor is able to exit from the display surface of the display panel, and also ensure that the fingerprint recognition sensor is able to receive the light reflected by the finger.

Figure 21:
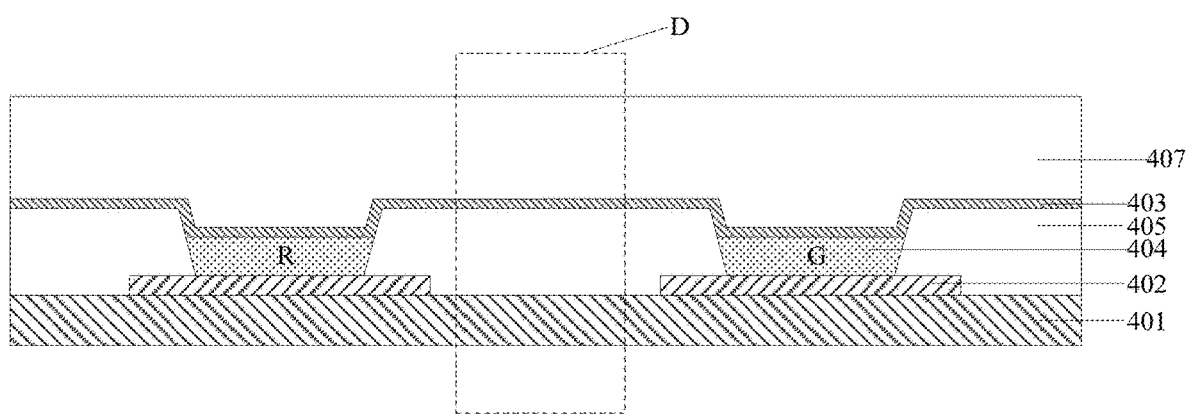
FIG. 21 illustrates a schematic cross-sectional view of an exemplary display panel in a fingerprint recognition region.

The display panel according to various embodiments of the present disclosure may be an organic electroluminescence display panel. FIG. 21 illustrates a schematic cross-sectional view of an exemplary display panel in a fingerprint recognition region. Referring to FIG. 21, the display panel may include a base substrate 401, a first electrode 402 disposed on the base substrate 401, a second electrode 403 disposed on the side of the first electrode 402 facing away from the base substrate 401, an organic light-emitting layer 404 disposed between the first electrode 402 and the second electrode 403, a pixel definition layer 405 disposed between the base substrate 401 and the second electrode 403, and an encapsulation layer 407 disposed on the side of the second electrode 403 facing away from the base substrate 401. The pixel definition layer 405 may include a plurality of openings to define the position of each pixel. In FIG. 21, red (R) pixels and green (G) pixels are used as examples of the plurality of pixels for illustration. As shown in FIG. 21, the first electrode 402 may not have any pattern in the transparent region D, so that the light transmission of the transparent region D can be ensured. As such, light may be able to pass through the display panel. The first electrode 402 may be selected as an anode, the second electrode 403 may be selected as a cathode, and the organic light-emitting layer 404 may be electroluminescent under the action of the first electrode 402 and the second electrode 403.

Further, because of the presence of pixels in the fingerprint recognition region, during the display stage, the fingerprint recognition region may be able to display normally, and the fingerprint recognition region may be controlled in a time sharing manner to display pictures or perform fingerprint recognition.

In actual applications, in the fingerprint recognition region of the display device according to various embodiments of the present disclosure, the display device may not have any metal pattern in the gap between any two adjacent pixels.

During the manufacturing process of the display panel, the metal pattern disposed between adjacent pixels in the fingerprint recognition region may be cut out to make the gap between adjacent pixels in the fingerprint recognition region transparent, such that light may be able to pass through the fingerprint recognition region of the display panel. In addition, the insulating layer in the gap between adjacent pixels in the fingerprint recognition region may be made of a material with high transparency, e.g. polyimide (PI), to ensure that the fingerprint recognition region has desired transparency. In some other embodiments, the pixel density in the fingerprint recognition region C may be set equal to the pixel density in the normal display region B.

For example, referring to FIG. 16, the display device according to various embodiments of the present disclosure may also include a fingerprint recognition sensor 106. The through hole T may be disposed between the fingerprint recognition sensor 106 and the display panel 101, and in the direction perpendicular to the plane where the display panel 101 is located, the fingerprint recognition sensor 106 may be completely overlapped with the through hole T.

In some embodiments, the size of the fingerprint recognition sensor 106 may be larger than the size of the through hole T. Therefore, in the direction perpendicular to the plane where the display panel 101 is located, the fingerprint recognition sensor 106 and the through hole T may be completely overlapped with each other. That is, the fingerprint recognition sensor 106 may fully cover the through hole T in the direction perpendicular to the display panel. As such, all the light reflected by the finger can be directed to the fingerprint recognition sensor 106, thereby preventing the light reflected by the finger from exiting from the edge without being incident onto the fingerprint recognition sensor 106, which affects the accuracy of fingerprint recognition.

In one embodiment, the fingerprint recognition sensor 106 may be disposed on the main board of the display device. The distance between the fingerprint recognition sensor 106 and the flexible circuit board 102 may be determined by the specifications of the fingerprint recognition sensor 106. In addition to the case where the fingerprint recognition sensor 106 is separated from the flexible circuit board 102 by a certain distance, the fingerprint recognition sensor 106 may be directly in contact with the flexible circuit board 102, or the fingerprint recognition sensor 106 may be separated from the flexible circuit board 102 by a layer of an adhesive layer, a protective film, or a frame of the entire device.

In actual applications, in the display device according to various embodiments of the present disclosure, the electrostatic discharge section of the flexible circuit board may be electrically connected to a fixed potential.

For example, the electrostatic discharge section may be connected to a fixed potential in the flexible circuit board, or may be connected to a fixed potential in the display panel. The electrostatic discharge section may be connected to the fixed potential through a wire, such that the static electricity may be conducted to the fixed potential for discharging. In one example, the electrostatic discharge section may be connected to a ground point so that static electricity can be conducted to the ground.

According to the flexible circuit board and the display device provided by various embodiments of the present disclosure, the cover layer has a hollowed-out region located at least at the edge of one side of the through hole, and the conductive layer includes an electrostatic discharge section exposed in the hollowed-out region. When static electricity is generated in the vicinity of the through hole, the static electricity may be conducted out through the electrostatic discharge section, thereby avoiding the accumulation of charges in the fingerprint recognition region and preventing undesired display performance.

Compared to existing flexible circuit boards and display devices, the disclosed flexible circuit board and display device may demonstrate the following exemplary advantages.

According to the disclosed flexible circuit board and display device, the flexible circuit board includes a substrate, a conductive layer disposed on the surface of the substrate, and a cover layer disposed on the conductive layer facing away from the substrate. The flexible circuit board is provided with a through hole penetrating through the flexible circuit board in the thickness direction. The cover layer is provided with a hollowed-out region located at least at the edge of one side of the through hole. The conductive layer may include an electrostatic discharge section exposed in the hollowed-out region. In the disclosed flexible circuit board, because the cover layer includes a hollowed-out region located at least at the edge of one side of he through hole and the conductive layer includes an electrostatic discharge section exposed in the hollowed-out region, when static electricity is generated in the vicinity of the through hole, the static electricity can be conducted out through the electrostatic discharge section, thereby avoiding the accumulation of charges in the fingerprint recognition region and preventing undesired display performance.

The various embodiments in the present disclosure are described in a progressive manner, and each embodiment focuses on differences from other embodiments, and the same or similar parts between the various embodiments may be referred to each other.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A flexible circuit board, comprising:
   a substrate;
   a conductive layer, disposed on the substrate; and
   a cover layer, disposed on a side of the conductive layer facing away from the substrate, wherein:
   the flexible circuit board is provided with a through hole penetrating through the flexible circuit board in a thickness direction,
   the cover layer includes a hollowed-out region located at least at an edge of one side of the through hole, and
   the conductive layer includes an electrostatic discharge section exposed in the hollowed-out region.

2. The flexible circuit board according to claim 1, wherein:
   the hollowed-out region has a ring structure surrounding the through hole.

3. The flexible circuit board according to claim 2, wherein:
   an inner edge of the hollowed-out region is overlapped with an outer edge of the through hole.

4. The flexible circuit board according to claim 1, wherein:
   the hollowed-out region is separated from the through hole by a distance.

5. The flexible circuit board according to claim 4, wherein:
   the distance between the hollowed-out region and the through hole is larger than 0 and smaller than or equal to approximately 1 cm.

6. The flexible circuit board according to claim 1, wherein:
   the electrostatic discharge section has a hollow structure.

7. The flexible circuit board according to claim 1, wherein:
   the electrostatic discharge section has a grid-like structure.

8. The flexible circuit board according to claim 1, wherein:
   in the flexible circuit board, the conductive layer and the cover layer are disposed on both surfaces of the substrate.

9. The flexible circuit board according to claim 1, wherein:
   the cover layer further includes an adhesive layer, and a protective layer disposed on a side of the adhesive layer facing away from the substrate.

10. The flexible circuit board according to claim 9, wherein:
    the cover layer further includes an electromagnetic interference (EMI) film layer located on a side of the protective layer facing away from the substrate.

11. The flexible circuit board according to claim 1, wherein:
    the electrostatic discharge section is made of a metal material or a transparent conductive material.

12. A display device, comprising:
    a display panel, including a display surface and a back surface opposite to the display surface, and
    a flexible circuit board, including a substrate, a conductive layer disposed on the substrate, and a cover layer disposed on a side of the conductive layer facing away from the substrate, wherein:
    the flexible circuit board is provided with a through hole penetrating through the flexible circuit board in a thickness direction,
    the cover layer includes a hollowed-out region located at least at an edge of one side of the through hole,
    the conductive layer includes an electrostatic discharge section exposed in the hollowed-out region, one end of the flexible circuit board is connected to the display surface of the display panel, and another end of the flexible circuit board is bent to the back surface of the display panel, the display panel includes a display region, wherein the display region includes a fingerprint recognition region, and in a direction perpendicular to a plane where the display panel is located, the fingerprint recognition region is overlapped with the through hole.

13. The display device according to claim 12, wherein:
the display region contains a plurality of pixels, and
the display region includes a normal display region, and a pixel density in the fingerprint recognition region is smaller than a pixel density in the normal display region.

14. The display device according to claim 12, wherein:
in the fingerprint recognition region, the display panel has no metal pattern present in a gap between any two adjacent pixels of the plurality of pixels.

15. The display device according to claim 12, further including a fingerprint recognition sensor, wherein:

the through hole is disposed between the fingerprint recognition sensor and the display panel; and in the direction perpendicular to the plane where the display panel is located, the fingerprint recognition sensor is completely overlapped with the through hole.

16. The display device according to claim 12, wherein:
the electrostatic discharge section of the flexible circuit board is electrically connected to a fixed potential.

17. The display device according to claim 12, wherein:
the hollowed-out region of the flexible circuit board has a ring structure surrounding the through hole.

18. The display device according to claim 17, wherein:
an inner edge of the hollowed-out region is overlapped with an outer edge of the through hole.

19. The display device according to claim 12, wherein:
the hollowed-out region is separated from the through hole by a distance.

20. The display device according to claim 19, wherein:
the distance between the hollowed-out region and the through hole is larger than 0 and smaller than or equal to approximately 1 cm.

* * * * *